US012352826B2

(12) United States Patent
Srivastava et al.

(10) Patent No.: US 12,352,826 B2
(45) Date of Patent: Jul. 8, 2025

(54) CURRENT MEASUREMENT ARCHITECTURE

(71) Applicant: Arm Limited, Cambridge (GB)

(72) Inventors: Ashwani Kumar Srivastava, Austin, TX (US); Yves Thomas Laplanche, Valbonne (FR); Ramesh Manohar, Bangalore (IN)

(73) Assignee: Arm Limited, Cambridge (GB)

( * ) Notice: Subject to any disclaimer, the term of this patent is extended or adjusted under 35 U.S.C. 154(b) by 36 days.

(21) Appl. No.: 18/127,871

(22) Filed: Mar. 29, 2023

(65) Prior Publication Data

US 2024/0329153 A1 Oct. 3, 2024

(51) Int. Cl.
*G01R 31/52* (2020.01)

(52) U.S. Cl.
CPC .................. *G01R 31/52* (2020.01)

(58) Field of Classification Search
CPC ....................................... G01R 31/52
USPC ........................................ 324/555
See application file for complete search history.

(56) References Cited

U.S. PATENT DOCUMENTS

| | | | |
|---|---|---|---|
| 5,424,662 A | 6/1995 | Bonaccio | |
| 6,262,585 B1 | 7/2001 | Frodsham et al. | |
| 7,116,110 B1* | 10/2006 | Li | G01R 31/52 324/537 |
| 7,539,467 B1* | 5/2009 | Doyle | H03K 19/0016 455/343.1 |
| 2005/0213387 A1 | 9/2005 | Kubo et al. | |
| 2007/0040575 A1* | 2/2007 | Afghahi | H03K 19/0016 326/34 |
| 2008/0209285 A1* | 8/2008 | Acharyya | G01R 31/318575 714/724 |
| 2009/0212760 A1 | 8/2009 | Von Staudt et al. | |
| 2010/0188121 A1 | 7/2010 | Jung | |
| 2010/0201376 A1 | 8/2010 | Ouyang et al. | |
| 2015/0109867 A1* | 4/2015 | Yamada | G11C 29/50008 365/189.07 |
| 2019/0238100 A1 | 8/2019 | Kimura | |
| 2020/0036318 A1* | 1/2020 | Fujita | G01R 31/52 |
| 2020/0041557 A1* | 2/2020 | Pradelles | G01R 31/52 |
| 2020/0067303 A1* | 2/2020 | Uchida | H02H 7/1203 |
| 2020/0116778 A1* | 4/2020 | Reitz | G01R 31/52 |
| 2020/0241080 A1* | 7/2020 | Stahlhut | H02M 7/4835 |
| 2022/0052660 A1 | 2/2022 | Steiner et al. | |

OTHER PUBLICATIONS

PCT International Search Report and Written Opinion; PCT/GB2024/050585; Jun. 18, 2024.

(Continued)

*Primary Examiner* — Christopher P McAndrew
(74) *Attorney, Agent, or Firm* — Pramudji Law Group PLLC; Ari Pramudji

(57) ABSTRACT

Various implementations described herein are related to a device with fabrication test circuitry having transistors arranged in a parallel branch configuration between a supply voltage and a single pad. In some applications, each transistor in an off-current branch may be separately deactivated so as to test leakage current applied to the pad by way of the off-current branch, and also, each transistor in an on-current branch may be deactivated so as to further test the leakage current applied to the pad by way of the off-current branch.

20 Claims, 7 Drawing Sheets

(56) References Cited

OTHER PUBLICATIONS

Zhang, et al.; A Closed-Loop Current Source Gate Driver with Active Gate Current Control for Dynamic Voltage Balancing in Series-Connected GaN HEMTs; IEEE Open Journal of Power Electronics; vol. 2; Sep. 1, 2021. DOI: 10.1109/OJPEL.2021.3109215.

* cited by examiner

CURRENT MEASUREMENT ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In various modern circuit architectures, conventional process circuitry may have multiple devices that need on-current and off-current measurements for each device on a silicon wafer. Typically, conventional process circuitry consists of multiple voltage source pins and multiple pads (or bumps) coupled in parallel, wherein each device in conventional process circuitry is coupled between each voltage source (VDD) pin and each pad. Thus, multiple pads for each device is typically needed to measure off-current while on-current measurements are performed. Therefore, each device requires many measurements on silicon, which is inefficient and cumbersome, since a significantly large area is needed to implement a large number of pads that are connected to each device. As such, in these types of circuits, there exists a need for area efficient circuitry that reduces the number of pads required to perform on-current and off-current measurements.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to current measurement schemes and techniques for various circuit related applications in physical designs. Also, in some implementations, various schemes and techniques described herein provide for a novel current measurement architecture having multiple transistor devices with a single measurement pad or bump. In some implementations, various schemes and techniques described herein may provide for a novel current measurement architecture that enables measuring individual device on-current (ION) and/or off-current (IOFF) in a multiple device environment on a single pad with repeating current measurements on silicon. Also, these schemes and techniques save silicon area and reduce overall pad constraints.

Various implementations of current measurement schemes and techniques for various circuit applications will be described in FIGS. 1A-1B, 2A-2B and 3.

Figure 1A:
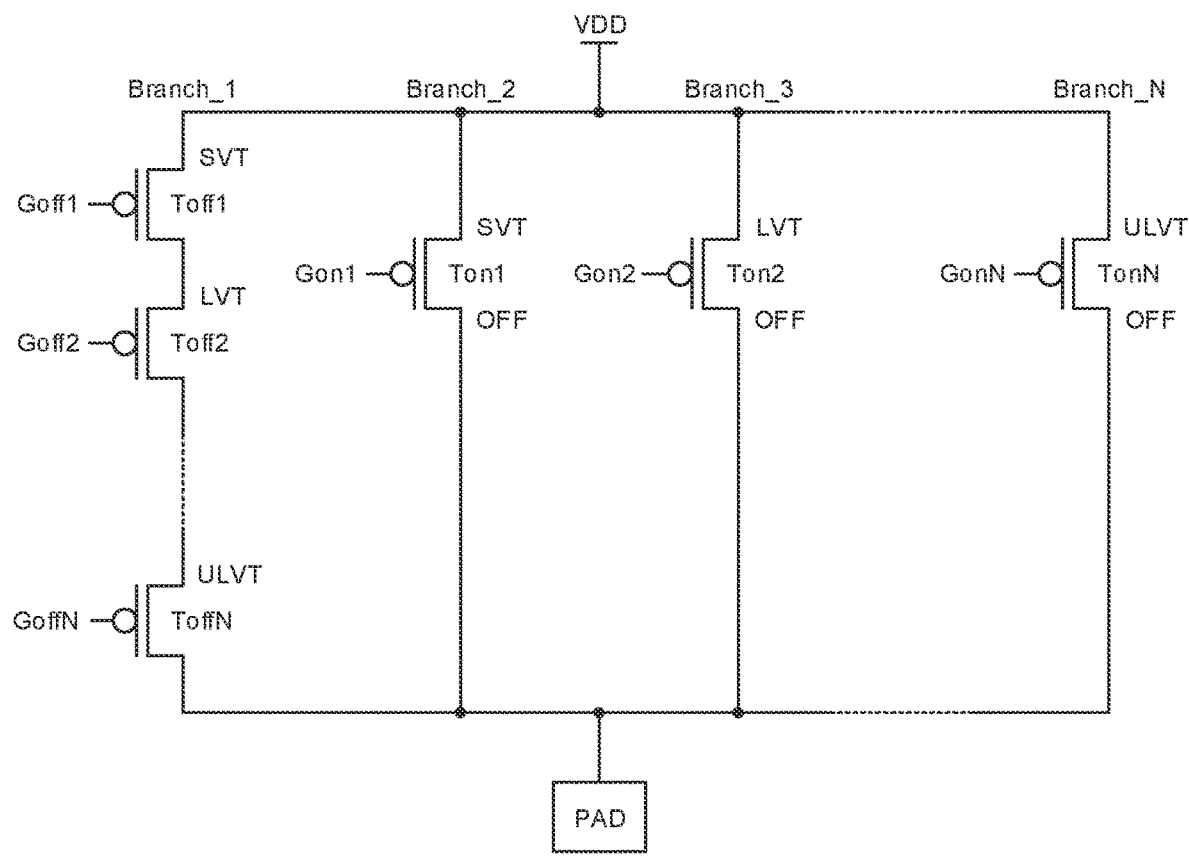
FIGS. 1A-1B illustrate various diagrams of current measurement architecture for off-current conditions in accordance with implementations described herein.
Figure 1B:
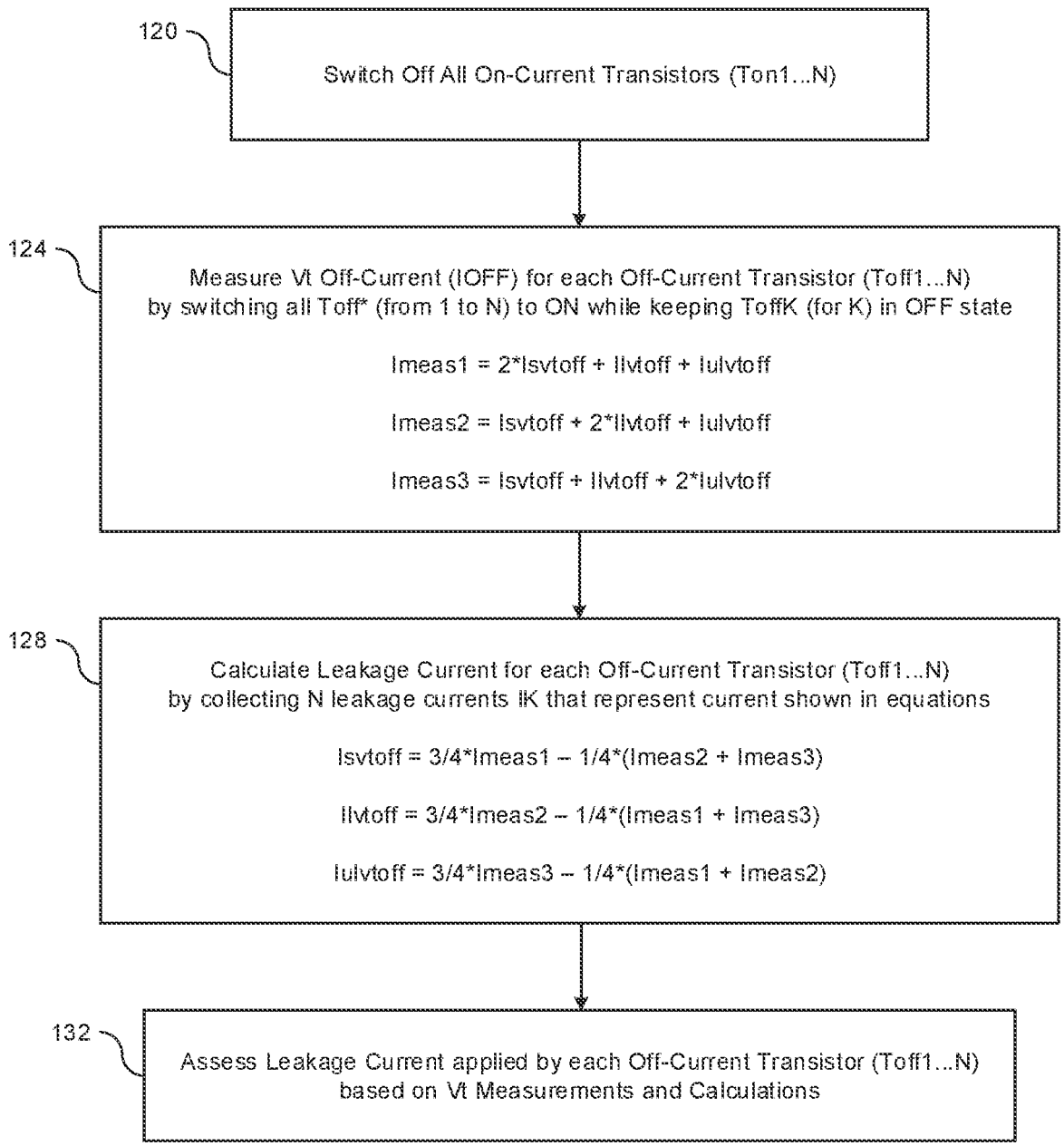

FIGS. 1A-1B illustrate various diagrams of current measurement architecture along with various schemes and techniques associated with off-current conditions, events and/or operations in accordance with various applications described herein. In particular, FIG. 1A shows a schematic diagram 100A of current measurement architecture 104A for off-current conditions, events and/or operations, and also, FIG. 1B shows a process diagram 100B of a method 104B for implementing various current measurement schemes and techniques for off-current conditions, events and/or operations.

In various implementations, the current measurement architecture 104A refers to off-current measurement architecture that may be implemented as a system or a device having various integrated circuit (IC) components that are arranged and coupled together as an assemblage or some combination of parts that provide for physical circuit designs and various related structures. In various instances, a method of designing, providing and fabricating the current measurement architecture 104A as an integrated system or device may involve use of various IC circuit components and/or structures described herein so as to thereby implement fabrication schemes and techniques associated therewith. Also, the current measurement architecture 104A may be integrated with various computing circuitry and/or related components on a single chip, and also, the current measurement architecture 104A may be implemented in various embedded devices and/or systems for automotive, mobile, computer, server and Internet-of-things (IoT) applications.

As shown in FIG. 1A, the current measurement architecture 104A may refer to off-current measurement architecture for various circuit applications. Also, the current measurement architecture 104A may include fabrication test circuitry with some number (N) of transistors (Toff1, Toff2, . . . , ToffN and Ton1, Ton2, . . . , TonN) that are arranged in a parallel branch configuration between a supply voltage (VDD) and a pad (PAD) or bump (BMP), such as, e.g., a single pad or a single bump. In some applications, each transistor (Toff1, Toff2, . . . , ToffN) in a first branch (Branch_1) may be separately activated so as to test leakage current (or off-current) applied to the (PAD) by each transistor (Toff1, Toff2, . . . , ToffN) in the first branch (Branch_1), and also, each transistor (Ton1, Ton2, . . . , TonN) in the remaining branches (Branch_2, Branch_3, . . . , Branch_N) may be deactivated so as to further test the leakage current (or off-current) applied to the pad (PAD).

In various implementations, the first branch (Branch_1) may be referred to as an off-current branch, which may be a single off-current branch, and the remaining branches (Branch_2, Branch_3, . . . , Branch_N) may be referred to as a number (N) of on-current branches, including, e.g., a second branch (Branch_2), a third branch (Branch_3), . . . , and a last branch (Branch_N). Also, in some cases, the current measurement architecture 104A may refer to fabrication test circuitry having transistors arranged in a parallel branch configuration between supply voltage (VDD) and single pad (PAD). In this instance, each transistor (Toff1, Toff2, . . . , ToffN) in the off-current branch (Branch_1) may be separately deactivated (e.g., in an alternating manner) so as to thereby test leakage current applied to the pad (PAD) by way of the off-current branch (Branch_1). Also, in this instance, each transistor (Ton1, Ton2, . . . , TonN) in each on-current branch (Branch_2, Branch_3, . . . , Branch_N) may be deactivated so as to further test the leakage current applied to the pad (PAD) by way of the off-current branch (Branch_1).

In some implementations, the leakage current may refer to off-current operation of the transistors (Toff1, Toff2, . . . , ToffN), and the pad (PAD) may function as a current sink during off-current operation. Also, each transistor (Toff1, Toff2, . . . , ToffN) in the off-current branch (Branch_1) may be separately deactivated (and/or alternately deactivated) so as to thereby measure, calculate and assess the leakage current or off-current applied to the pad (PAD) by way of the off-current branch (Branch_1). Also, each transistor (Toff1, Toff2, . . . , ToffN) in the off-current branch may be separately deactivated so as to thereby test leakage current passed by each transistor (Toff1, Toff2, . . . , ToffN) in the off-current branch (Branch_1) to the pad (PAD) by way of significantly reducing drive current through each transistor (Toff1, Toff2, . . . , ToffN) to the pad (PAD).

In some implementations, the first branch or off-current branch (Branch_1) may refer to a single off-current branch with multiple transistors (Toff1, Toff2, . . . , ToffN) that are coupled in series so as to test leakage current applied to the pad (PAD) by way of the first branch or off-current branch (Branch_1). Also, the on-current branches (Branch_2, Branch_3, . . . , Branch_N) may include multiple on-current branches with each on-current branch (Branch_2, Branch_3, . . . , Branch_N) having a single transistor (Toff1, Toff2, . . . , ToffN, respectively) coupled in parallel with each other single transistor in each other on-current branch so as to further test leakage current applied to the pad (PAD) by way of the first branch or the off-current branch (Branch_1).

In some implementations, as shown in FIG. 1A, the first branch or off-current branch (Branch_1) may have a number (N) of transistors (Toff1, Toff2, . . . , ToffN) that are coupled in series between the supply voltage (VDD) and the single pad (PAD). Also, each transistor (Toff1, Toff2, . . . , ToffN) in the first branch or off-current branch (Branch_1) may be referred to as an off-current transistor (Toff), and further, the series-coupled off-current transistors (Toff1, Toff2, . . . , ToffN) in the first branch or off-current branch (Branch_1) may be coupled in parallel with each on-current transistor (Ton1, Ton2, . . . , TonN) in their respective on-current branch (Branch_2, Branch_3, . . . , Branch_N, respectively). Also, in some instances, the first branch or off-current branch (Branch_1) may have a first off-current transistor (Toff1) with a gate (Goff1) and a standard voltage threshold (SVT). Also, the first branch or off-current branch (Branch_1) may have a second off-current transistor (Toff2) with a gate (Goff2) and a low voltage threshold (LVT). Also, the first branch or off-current branch (Branch_1) may have a third or a next or a last off-current transistor (ToffN) with a gate (GoffN) and an ultra-low voltage threshold (ULVT).

Also, in some implementations, as shown in FIG. 1A, the on-current branches (Branch_2, Branch_3, . . . , Branch_N) may be coupled in parallel with the first branch or off-current branch (Branch_1) and with each other on-current branch. In some instances, the on-current branches (Branch_2, Branch_3, . . . , Branch_N) may have a second branch or a first on-current branch (Branch_2) including a first on-current transistor (Ton1) with a gate (Gon1) and a standard voltage threshold (SVT). Also, in a parallel on-current branch, the on-current branches (Branch_2, Branch_3, . . . , Branch_N) may include a third branch or a second on-current branch (Branch_3) having a second on-current transistor (Ton2) with a gate (Gon2) and a low voltage threshold (LVT). Also, in another parallel on-current branch, the on-current branches (Branch_2, Branch_3, . . . , Branch_N) may include a next (or last) branch or a next (or last) on-current branch (Branch_N) including a next (or last) on-current transistor (TonN) with a gate (GonN) and an ultra-low VT (ULVT).

Moreover, FIG. 1A includes a table (Table 1) that depicts a means to extract off-current (IOFF) for each off-current transistor (Toff1, Toff2, . . . , ToffN) in the off-current branch (Branch_1). In some instances, each transistor (Toff1, Toff2, . . . , ToffN) in the off-current branch (Branch_1) may be separately deactivated so as to test, measure and/or calculate the leakage current applied to the pad (PAD) by way of the off-current branch (Branch_1), and also, each transistor (Ton1, Ton2, . . . , TonN) in their respective on-current branches (Branch_2, Branch_3, . . . , Branch_N, respectively) may be deactivated so as to further test, measure and/or calculate the leakage current applied to the pad (PAD) by way of the off-current branch (Branch_1). As shown in Table 1, in a first operational mode (Mode1), off-current transistor (ToffN) may be deactivated (OFF) and off-current transistors (Toff1, Toff2) may be activated (ON) along with all on-current transistors (Ton1, Ton2, . . . , TonN) deactivated (OFF). Also, as shown in Table 1, in a second operational mode (Mode2), off-current transistor (Toff2) may be deactivated (OFF) and off-current transistors (Toff1, ToffN) may be activated (ON) along with all on-current transistors (Ton1, Ton2, . . . , TonN) deactivated (OFF). Also, as shown in Table 1, in a third operational mode (Mode3), off-current transistor (Toff1) may be deactivated (OFF) and off-current transistors (Toff2, ToffN) may be activated (ON) along with all on-current transistors (Ton1, Ton2, . . . , TonN) deactivated (OFF). These operational modes (1, 2 and 3) provide for testing, measuring, calculating and/or assessing leakage current in the first off-current branch (Branch_1) by separately testing each off-current transistor for leakage current at the pad (PAD).

In some implementations, on-current transistors (Ton1, Ton2, . . . , TonN) and off-current transistors (Toff1, Toff2, . . . , ToffN) may refer to p-type transistors. However, in various other implementations, various other types of transistors may be used, such as, e.g., n-type transistors, or similar, or some combination thereof to achieve similar results, behaviors and/or characteristics, in a manner as described herein.

As shown in FIG. 1B, the diagram 100B provides method 104B for extracting current (IOFF) measurement for off-current conditions, events and/or operations.

It should be understood that even though method 104B indicates a particular order of operation execution, in some instances, various certain portions of the operations may be executed in a different order, and on different systems. In other cases, additional operations and/or steps may be added to and/or omitted from method 104B. Also, method 104B may be implemented in hardware and/or software. If implemented in hardware, the method 104B may be implemented with various components and/or circuitry, as described herein in reference to FIG. 1A. Also, if implemented in software, method 104B may be implemented with program and/or software instruction processes configured for providing current measurement schemes, as described herein. Also, if implemented in software, instructions related to implementing the method 104B may be stored in memory and/or a database. In various instances, a computer or various other types of computing devices having a processor and memory may be configured to perform method 104B.

In various implementations, method 104B may refer to a method for extracting current measurements in off-current applications as an integrated system, device and/or circuit that involves use of various IC circuit components described herein so as to thereby implement current measurement schemes and techniques associated therewith. Further, the current measurement schemes may be integrated with computing circuitry and related components on a single chip, and current measurement schemes may be implemented in various embedded systems for various automotive, electronic, mobile and Internet-of-things (IoT) applications, including sensor nodes.

In various implementations, the method 104B may be used to manufacture, or cause to be manufactured, fabrication test circuitry with transistors that are coupled in parallel branches between a supply voltage (VDD) and a single pad. At block 120, method 104B may switch off one or more or all on-current transistors (e.g., Ton1, Ton2, . . . , TonN in FIG. 1A). At block 124, method 104B may separately measure voltage threshold (Vt) off-current (IOFF) for each off-current transistor (e.g., Toff1, Toff2, . . . , ToffN in FIG. 1A) by switching all Toff* (from 1 to N) to ON while keeping ToffK (for K) in OFF state. Also, in some applications, when using 3 devices, method 104B may measure leakage current in each parallel branch by separately deactivating each transistor to test leakage current applied to the pad, e.g., as indicated in FIGS. 1A and 1n the following equations:

$$Imeas1 = 2*Isvtoff + Ilvtoff + Iulvtoff$$
$$Imeas2 = Isvtoff + 2*Ilvtoff + Iulvtoff$$
$$Imeas3 = Isvtoff + Ilvtoff + 2*Iulvtoff$$

Please note that the above instance and various related equations are directed to the use of 3 devices, and it should be further noted that these equations may be applied to the use of any number of devices, wherein the sum may be different.

Also, in some applications, at block 128, method 104B may calculate leakage current for each off-current transistor (Toff1, Toff2, . . . , ToffN), e.g., by collecting N leakage currents IK that represent current shown in the following equations:

$$Isvtoff = 3/4*Imeas1 - 1/4*(Imeas2 + Imeas3)$$
$$Ilvtoff = 3/4*Imeas2 - 1/4*(Imeas1 + Imeas3)$$
$$Iulvtoff = 3/4*Imeas3 - 1/4*(Imeas1 + Imeas2)$$

Also, in some applications, at block 132, method 104B may assess leakage current applied by each off-current transistor (Toff1, Toff2, . . . , ToffN) based on the voltage threshold (Vt) measurements and calculations.

This shows that the leakage of the transistor k is given by:

$$I_{leak}^k = \frac{N}{N+1}I_k - \frac{1}{N+1}\sum_{i \neq k} I_i$$

In some implementations, the leakage current may refer to off-current operation of the transistors, the pad may function as a current sink during off-current operation, and each transistor may be separately deactivated so as to test leakage current passed by each off-current transistor to the pad by separately reducing drive current through each off-current transistor to the pad. Also, in various instances, measuring leakage current in each parallel branch may include separately deactivating each transistor so as to thereby test, measure, calculate and/or assess leakage current applied to the pad by way of each transistor. Also, in various instances, the parallel branches may include multiple branches coupled in parallel with each branch having a single transistor coupled in parallel with each other single transistor so as to test leakage current applied to the pad.

Figure 2A:
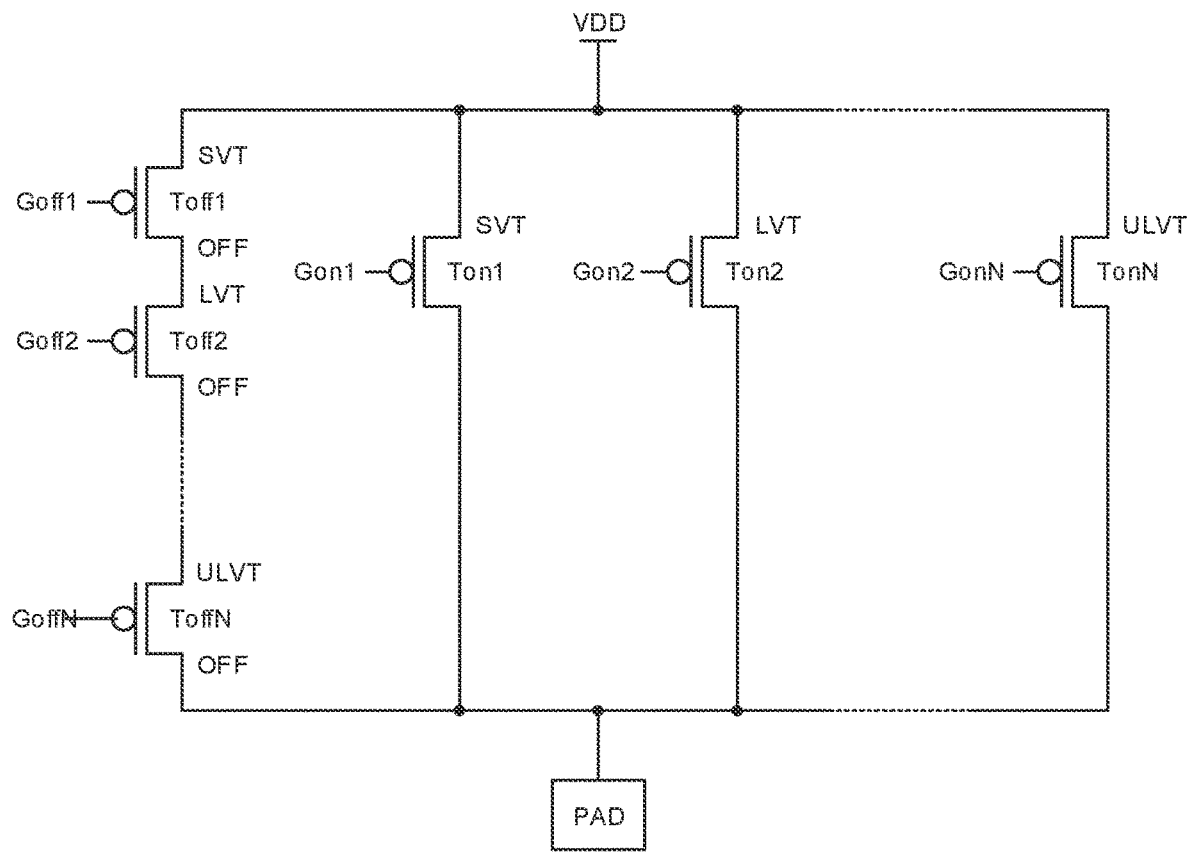
FIGS. 2A-2B illustrate various diagrams of current measurement architecture for on-current conditions in accordance with implementations described herein.
Figure 2B:
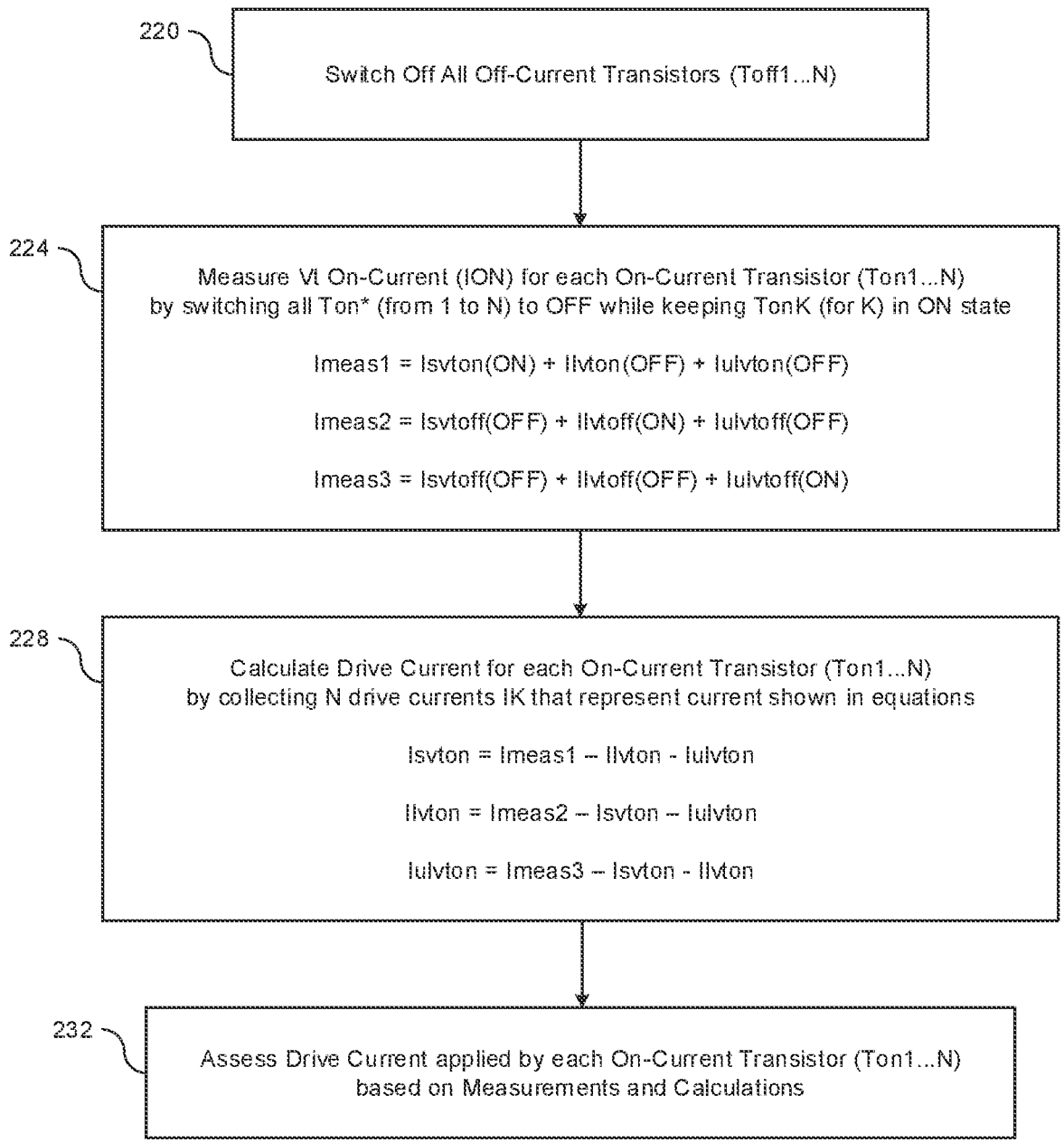

FIGS. 2A-2B illustrate various diagrams of current measurement architecture along with various schemes and techniques associated with on-current conditions, events and/or operations in accordance with various applications described herein. In particular, FIG. 2A shows a schematic diagram 200A of current measurement architecture 204A for on-current conditions, events and/or operations, and also, FIG. 2B shows a process diagram 200B of a method 204B for implementing various current measurement schemes and techniques for on-current conditions, events and/or operations.

In various implementations, the current measurement architecture 204A refers to on-current measurement architecture that may be implemented as a system or a device having various integrated circuit (IC) components that are arranged and coupled together as an assemblage or some combination of parts that provide for physical circuit designs and various related structures. In various instances, a method of designing, providing and fabricating the current measurement architecture 204A as an integrated system or device may involve use of various IC circuit components and/or structures described herein so as to thereby implement fabrication schemes and techniques associated therewith. Also, the current measurement architecture 204A may be integrated with various computing circuitry and/or related components on a single chip, and also, the current measurement architecture 204A may be implemented in various embedded devices and/or systems for automotive, mobile, computer, server and Internet-of-things (IoT) applications.

As shown in FIG. 2A, the current measurement architecture 204A may refer to on-current measurement architecture for various circuit applications. Also, the current measurement architecture 204A may include fabrication test circuitry with some number (N) of transistors (Toff1, Toff2, . . . , ToffN and Ton1, Ton2, . . . , TonN) that are arranged in a parallel branch configuration between a supply voltage (VDD) and a pad (PAD) or bump (BMP), such as, e.g., a single pad or a single bump. In some applications, each transistor (Toff1, Toff2, . . . , ToffN) in the first branch or the off-current branch (Branch_1) may be deactivated so as to test drive current (or on-current) applied to the (PAD) by way of the on-current branches (Branch_2, Branch_3, . . . , Branch_N), and further, each transistor (Ton1, Ton2, . . . , TonN) in the on-current branches (Branch_2, Branch_3, . . . , Branch_N) may be separately activated so as to test drive current (or on-current) applied to the pad (PAD) by way of each on-current branch (Branch_2, Branch_3, . . . , Branch_N).

In various implementations, the first branch (Branch_1) may be referred to as an off-current branch, which may be a single off-current branch, and the remaining branches (Branch_2, Branch_3, . . . , Branch_N) may be referred to as a number (N) of on-current branches, including, e.g., a second branch (Branch_2), a third branch (Branch_3), ..., and a last branch (Branch_N). Also, in some cases, the current measurement architecture 204A may refer to fabrication test circuitry having transistors arranged in a parallel branch configuration between supply voltage (VDD) and single pad (PAD). In this instance, all of transistors (Toff1, Toff2, ..., ToffN) in off-current branch (Branch_1) may be deactivated so as to thereby test drive current applied to the pad (PAD) by way of on-current branches (Branch_2, Branch_3, ..., Branch_N). Also, each transistor (Ton1, Ton2, ..., TonN) in each on-current branch (Branch_2, Branch_3, ..., Branch_N) may be separately (and/or alternately) activated so as to further test drive current applied to the pad (PAD) by way of each on-current branch (Branch_2, Branch_3, ..., Branch_N).

In some implementations, the drive current may refer to on-current operation of transistors (Ton1, Ton2, ..., TonN), and the pad (PAD) may function as a current source during on-current operation. Also, all transistors (Toff1, Toff2, ..., ToffN) in the off-current branch (Branch_1) may be deactivated so as to thereby measure, calculate and assess the drive current or on-current applied to the pad (PAD) by way of the on-current branches (Branch_2, Branch_3, ..., Branch_N). Also, each transistor (Ton1, Ton2, ..., TonN) in each on-current branch (Branch_2, Branch_3, ..., Branch_N) is separately activated so as to thereby measure, calculate and assess the drive current or on-current applied to the pad (PAD) by way of the on-current branches (Branch_2, Branch_3, ..., Branch_N). Also, in various applications, each transistor (Ton1, Ton2, ..., TonN) in each on-current branch may be separately activated so as to thereby test drive current passed by each transistor (Ton1, Ton2, ..., TonN) in each on-current branch (Branch_2, Branch_3, ..., Branch_N) to the pad (PAD) by way of passing drive current through each transistor (Ton1, Ton2, ..., TonN) to the pad (PAD).

In some implementations, the first branch or off-current branch (Branch_1) may refer to a single off-current branch with multiple transistors (Toff1, Toff2, ..., ToffN) that are coupled in series and deactivated so as to test drive current applied to the pad (PAD) by way of the on-current branches (Branch_2, Branch_3, ..., Branch_N). Also, on-current branches (Branch_2, Branch_3, ..., Branch_N) may include multiple on-current branches with each on-current branch (Branch_2, Branch_3, ..., Branch_N) with a single transistor (Toff1, Toff2, ..., ToffN, respectively) coupled in parallel with each other single transistor in each other on-current branch so as to test leakage current applied to the pad (PAD) by way of the on-current branches (Branch_2, Branch_3, ..., Branch_N).

In some implementations, as shown in FIG. 2A, the first branch or off-current branch (Branch_1) may have a number (N) of transistors (Toff1, Toff2, ..., ToffN) that are coupled in series between the supply voltage (VDD) and the single pad (PAD). Also, each transistor (Toff1, Toff2, ..., ToffN) in the first branch or off-current branch (Branch_1) may be referred to as an off-current transistor (Toff), and further, the series-coupled off-current transistors (Toff1, Toff2, ..., ToffN) in the first branch or off-current branch (Branch_1) may be coupled in parallel with each on-current transistor (Ton1, Ton2, ..., TonN) in their respective on-current branch (Branch_2, Branch_3, ..., Branch_N, respectively). Also, in some instances, the first branch or off-current branch (Branch_1) may have a first off-current transistor (Toff1) with a gate (Goff1) and a standard voltage threshold (SVT). Also, the first branch or off-current branch (Branch_1) may have a second off-current transistor (Toff2) with a gate (Goff2) and a low voltage threshold (LVT). Also, the first branch or off-current branch (Branch_1) may have a third or a next or a last off-current transistor (ToffN) with a gate (GoffN) and an ultra-low voltage threshold (ULVT).

Also, in some implementations, as shown in FIG. 2A, the on-current branches (Branch_2, Branch_3, ..., Branch_N) may be coupled in parallel with the first branch or off-current branch (Branch_1) and with each other on-current branch. In some instances, the on-current branches (Branch_2, Branch_3, ..., Branch_N) may have a second branch or a first on-current branch (Branch_2) including a first on-current transistor (Ton1) with a gate (Gon1) and a standard voltage threshold (SVT). Also, in a parallel on-current branch, the on-current branches (Branch_2, Branch_3, ..., Branch_N) may include a third branch or a second on-current branch (Branch_3) having a second on-current transistor (Ton2) with a gate (Gon2) and a low voltage threshold (LVT). Also, in another parallel on-current branch, the on-current branches (Branch_2, Branch_3, ..., Branch_N) may include a next (or last) branch or a next (or last) on-current branch (Branch_N) including a next (or last) on-current transistor (TonN) with a gate (GonN) and an ultra-low VT (ULVT).

Moreover, FIG. 2A includes a table (Table 2) that depicts a means to extract on-current (ION) for each on-current transistor (Ton1, Ton2, ..., TonN) in the on-current branches (Branch_2, Branch_3, ..., Branch_N). In various instances, each transistor (Ton1, Ton2, ..., TonN) in each on-current branch (Branch_2, Branch_3, ..., Branch_N) may be separately activated so as to test, measure and/or calculate the drive current applied to the pad (PAD) by way of each on-current branch (Branch_2, Branch_3, ..., Branch_N), and also, each transistor (Ton1, Ton2, ..., TonN) in respective on-current branches (Branch_2, Branch_3, ..., Branch_N, respectively) may be activated so as to further test, measure and/or calculate drive current applied to the pad (PAD) by way of respective on-current branches (Branch_2, Branch_3, ..., Branch_N). Also, as shown in Table 2, in a first operational mode (Mode1), on-current transistor (Ton1) may be activated (ON) and on-current transistors (Ton2, TonN) may be deactivated (OFF) and with all off-current transistors (Toff1, Toff2, ..., ToffN) deactivated (OFF). Also, as shown in Table 2, in a second operational mode (Mode2), the on-current transistor (Ton2) may be activated (ON) and on-current transistors (Ton1, TonN) may be deactivated (OFF) and with all off-current transistors (Toff1, Toff2, ..., ToffN) deactivated (OFF). Further, as shown in Table 2, in a third operational mode (Mode3), the on-current transistor (TonN) may be activated (ON) and on-current transistors (Ton1, Ton2) may be deactivated (OFF) and with all off-current transistors (Toff1, Toff2, ..., ToffN) deactivated (OFF). These operational modes (1, 2 and 3) provide for testing, measuring, calculating and/or assessing drive current in each of the on-current branches (Branch_2, Branch_3, ..., Branch_N) by separately testing each on-current transistor in each respective parallel on-current branch for drive current at the pad (PAD).

In some implementations, on-current transistors (Ton1, Ton2, ..., TonN) and off-current transistors (Toff1, Toff2, ..., ToffN) may refer to p-type transistors. However, in various other implementations, various other types of transistors may be used, such as, e.g., n-type transistors, or similar, or some combination thereof to achieve similar results, behaviors and/or characteristics, in a manner as described herein.

As shown in FIG. 2B, the diagram 200B shows a method 204B for extracting current (ION) measurement for on-current conditions, events and/or operations.

It should be understood that even though method 204B indicates a particular order of operation execution, in some instances, various certain portions of the operations may be executed in a different order, and on different systems. In other cases, additional operations and/or steps may be added to and/or omitted from method 204B. Also, method 204B may be implemented in hardware and/or software. If implemented in hardware, the method 204B may be implemented with various components and/or circuitry, as described herein in reference to FIG. 2A. Also, if implemented in software, method 204B may be implemented with program and/or software instruction processes configured for providing current measurement schemes, as described herein. Also, if implemented in software, instructions related to implementing the method 204B may be stored in memory and/or a database. In various instances, a computer or various other types of computing devices having a processor and memory may be configured to perform method 204B.

In various implementations, method 204B may refer to a method for extracting current measurements in on-current applications as an integrated system, device and/or circuit that involves use of various IC circuit components described herein so as to thereby implement current measurement schemes and techniques associated therewith. Further, the current measurement schemes may be integrated with computing circuitry and related components on a single chip, and current measurement schemes may be implemented in various embedded systems for various automotive, electronic, mobile and Internet-of-things (IoT) applications, including sensor nodes.

In various implementations, the method 204B may be used to manufacture, or cause to be manufactured, fabrication test circuitry with transistors that are coupled in parallel branches between a supply voltage (VDD) and a single pad. At block 220, method 204B may switch off one or more or all off-current transistors (e.g., Toff1, Toff2, . . . , ToffN in FIG. 2A). At block 224, method 204B may separately measure voltage threshold (Vt) on-current (ION) for each on-current transistor (e.g., Ton1, Ton2, . . . , TonN in FIG. 2A) by switching all Ton* (from 1 to N) to OFF while keeping TonK (for K) in ON state. Also, in some applications, method 204B may measure drive current in each parallel branch by separately activating each transistor to test drive current applied to the pad, e.g., in a manner as indicated in FIG. 2A and in the following equations:

$$Imeas1 = Isvton(\text{ON}) + Ilvton(\text{OFF}) + Iulvton(\text{OFF})$$

$$Imeas2 = Isvtoff(\text{OFF}) + Ilvtoff(\text{ON}) + Iulvtoff(\text{OFF})$$

$$Imeas3 = Isvtoff(\text{OFF}) + Ilvtoff(\text{OFF}) + Iulvtoff(\text{ON})$$

Also, in some applications, at block 228, method 204B may calculate drive current for each on-current transistor (Ton1, Ton2, . . . , TonN), e.g., by collecting N drive currents IK that represent current shown in the following equations:

$$Isvton = Imeas1 - Ilvton - Iulvton$$

$$Ilvton = Imeas2 - Isvton - Iulvton$$

$$Iulvton = Imeas3 - Isvton - Ilvton$$

This shows that the leakage of the transistor k is given by:

$$I_{parasite} = (N+1)I_0 - (I_1 + I_2 + \ldots + I_N)$$

$$I_{leak}^k = I_k - I_0$$

Also, in some applications, at block 232, method 204B may assess drive current applied by each on-current transistor (Ton1, Ton2, . . . , TonN) based on the voltage threshold (Vt) measurements and calculations.

In some implementations, the drive current may refer to on-current operation of the transistors, the pad may function as a current source during on-current operation, and each transistor may be activated to test drive current passed by each transistor to the pad by separately driving current through each transistor to the pad. Also, in some instances, measuring drive current in each parallel branch may include separately activating each on-current transistor to test, measure, calculate and/or assess drive current applied to the pad by way of each on-current transistor. Also, in some instances, the parallel branches may include multiple branches that are coupled in parallel with each other branch having a single transistor coupled in parallel with each other single transistor in each other parallel branch so as to test drive current applied to the pad.

Figure 3:
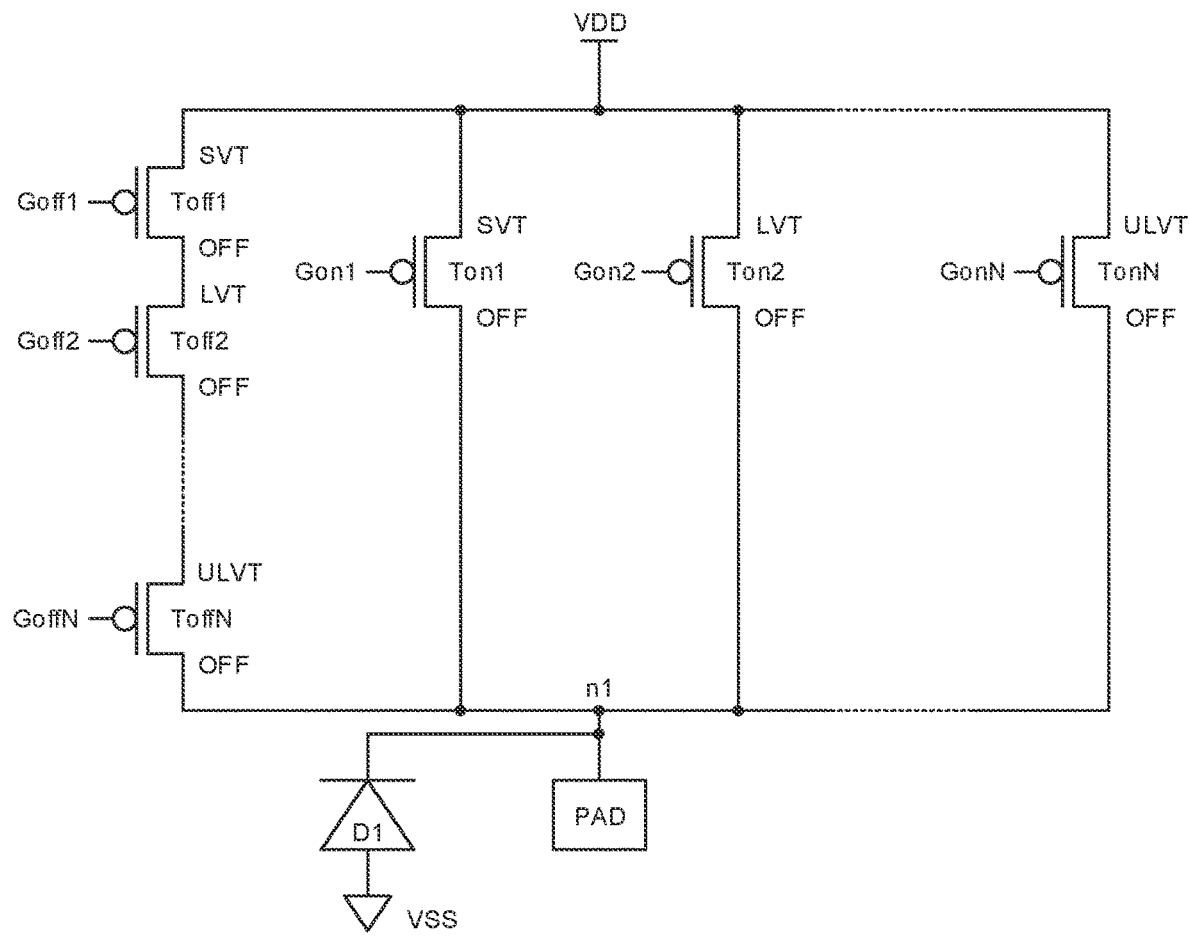
FIG. 3 illustrates a diagram of current measurement architecture for electro-static discharge conditions in accordance with implementations described herein.

FIG. 3 illustrates a diagram 300 of current measurement architecture 304 for electro-static discharge (ESD) events, conditions and/or operations in accordance with various implementations described herein. Also, various circuit components, devices and structures of the current measurement architecture 304 shown in FIG. 3 may be similar in scope, behavior and functionality as to those similar elements shown and described in the current measurement architectures 104A, 204A in FIGS. 1A, 2A, respectively.

In various implementations, the current measurement architecture 304 refers to ESD-current (IESD) measurement architecture that may be implemented as a system or a device having various integrated circuit (IC) components that are arranged and coupled together as an assemblage or some combination of parts that provide for physical circuit designs and related structures. In some instances, a method of designing, providing and fabricating the current measurement architecture 304 as an integrated system or device may involve use of various IC circuit components and/or structures described herein so as to thereby implement fabrication schemes and techniques associated therewith. Also, current measurement architecture 304 may be integrated with various computing circuitry and/or related components on a single chip, and also, current measurement architecture 304 may be implemented in various embedded devices and/or systems for automotive, mobile, computer, server and Internet-of-things (IoT) applications.

As shown in FIG. 3, the current measurement architecture 304 may refer to ESD-current measurement architecture for various circuit applications. Also, the current measurement architecture 304 may include fabrication test circuitry with a number (N) of transistors (Toff1, Toff2, . . . , ToffN and Ton1, Ton2, . . . , TonN) arranged in parallel branch configuration between a supply voltage (VDD) and a pad (PAD) or bump (BMP), such as, e.g., a single pad or a single bump. Also, in various applications, a diode clamp (D1) may be coupled between the transistors and ground (VSS or GND), wherein the diode clamp (D1) may be utilized to test drive current (on-current) and/or leakage current (off-current) applied to the pad (PAD) during electro-static discharge (ESD) events, conditions and/or operations of the fabrication test circuitry.

In some implementations, the diode clamp (D1) may include a single diode that is coupled between the transistors (Toff1, Toff2, . . . , ToffN and Ton1, Ton2, . . . , TonN) at node (n1) and ground (VSS or GND). In other implementations, the diode clamp (D1) may include multiple diodes coupled in series between transistors (Toff1, Toff2, . . . , ToffN and Ton1, Ton2, . . . , TonN) at node (n1) and ground (VSS or GND). Also, as shown, the single pad (PAD) may also be coupled to the node (n1).

Also, FIG. 3 includes a table (Table 3) that depicts a means to extract ESD-current (IESD) for the transistors (Toff1, Toff2, . . . , ToffN and Ton1, Ton2, . . . , TonN) in the parallel branches (Branch_1, Branch_2, Branch_3, . . . , Branch_N). In some instances, each transistor (Toff1, Toff2, . . . , ToffN and Ton1, Ton2, . . . , TonN) in each parallel branch (Branch_1, Branch_2, Branch_3, . . . , Branch_N) are deactivated so as to test, measure, calculate and/or assess the ESD-current (IESD) applied to the pad (PAD) by way of each parallel branch (Branch_1, Branch_2, Branch_3, . . . , Branch_N).

As shown in Table 3, in a first operational mode (Mode1), off-current transistors (Toff1, Toff2, . . . , ToffN) are deactivated (OFF), and on-current transistors (Ton1, Ton2, . . . , TonN) are also deactivated (OFF). Also, in a second operational mode (Mode2), the off-current transistors (Toff1, Toff2, . . . , ToffN) are deactivated (OFF), and the on-current transistors (Ton1, Ton2, . . . , TonN) are also deactivated (OFF). Also, in a third operational mode (Mode3), the off-current transistors (Toff1, Toff2, . . . , ToffN) are deactivated (OFF), and the on-current transistors (Ton1, Ton2, . . . , TonN) are also deactivated (OFF). Also, these operational modes (1, 2 and 3) provide for testing, measuring, calculating and/or assessing ESD-current (IESD) in the parallel branches (Branch_1, Branch_2, Branch_3, . . . , Branch_N) by testing the on-current transistors and the off-current transistors in their respective parallel branches for ESD-current (IESD) at the pad (PAD).

In some implementations, on-current transistors (Ton1, Ton2, . . . , TonN) and off-current transistors (Toff1, Toff2, . . . , ToffN) may refer to p-type transistors. However, in various other implementations, various other types of transistors may be used, such as, e.g., n-type transistors, or similar, or some combination thereof to achieve similar results, behaviors and/or characteristics, in a manner as described herein. Also, in various other implementations, this idea may be generalized to any type of device having an ON state and OFF state for which Ion>>Ioff in various instances when both currents are extracted for various different families of devices using, e.g., only a single pad (i.e., 1 PAD). Thus, the various implementations described herein may be applied to various device designs and/or circuitry that do not necessarily use transistors but any device having active and passive current states that may be characterized by the circuit designer.

Figure 4:
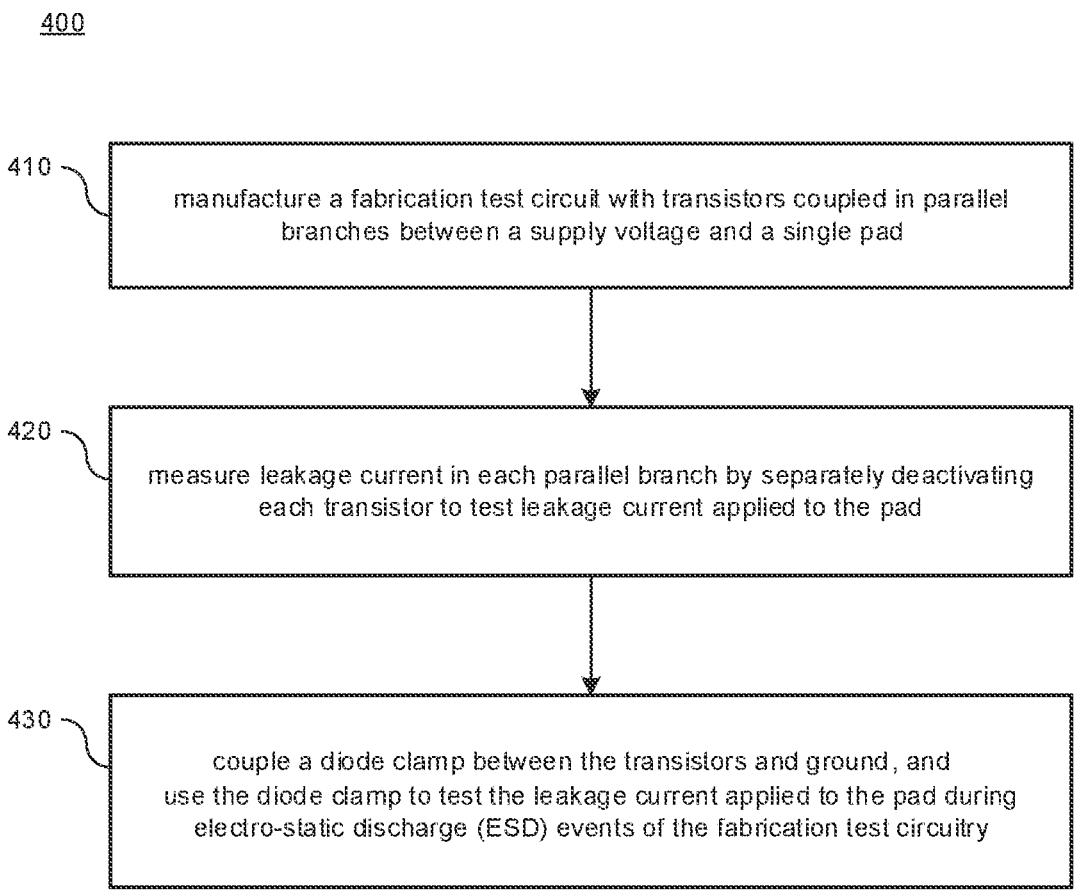
FIG. 4 illustrates a diagram of a method of providing current measurement architecture in accordance with various implementations described herein.

FIG. 4 illustrates a process flow diagram 400 of a method of providing current measurement architecture in accordance with implementations described herein.

It should be understood that even though the method 400 indicates a particular order of operation execution, in some instances, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, method 400 may be implemented with program and/or software instruction processes configured for providing current measurement architecture, as described herein. Also, if implemented in software, instructions related to implementing the method 400 may be stored in memory and/or a database. In various instances, a computer or various other types of computing devices having a processor and memory may be configured to perform method 400.

In various implementations, method 400 may refer to a method for designing, providing, fabricating and/or manufacturing register bank architecture with latches as an integrated system, device and/or circuit that involves use of various IC circuit components described herein so as to thereby implement current measuring techniques associated therewith. Also, the current measurement architecture may be integrated with computing circuitry and various related components on a single chip, and the current measurement architecture may be implemented in various embedded systems for various electronic, mobile and Internet-of-things (IoT) applications, including sensor nodes.

At block 410, method 400 may be configured to manufacture a fabrication test circuit with transistors coupled in parallel branches between a supply voltage and a single pad. At block 420, method 400 may measure leakage current in each parallel branch by separately deactivating each transistor to test leakage current applied to the pad. At block 430, method 400 may couple a diode clamp between the transistors and ground, and method 40 may use the diode clamp to test the leakage current applied to the pad during electrostatic discharge (ESD) events of the fabrication test circuitry. In some instances, leakage current may refer to off-current operation of the transistors, the pad may function as a current sink during off-current operation, and each transistor may be deactivated to test leakage current passed by each transistor to the pad by separately reducing drive current through each transistor to the pad. Also, measuring the leakage current in each parallel branch may include separately deactivating each transistor to test, measure, calculate and/or assess the leakage current applied to the pad by way of each transistor. Also, the parallel branches may include multiple branches coupled in parallel with each branch having a single transistor coupled in parallel with each other single transistor so as to test leakage current applied to the pad.

Figure 5:
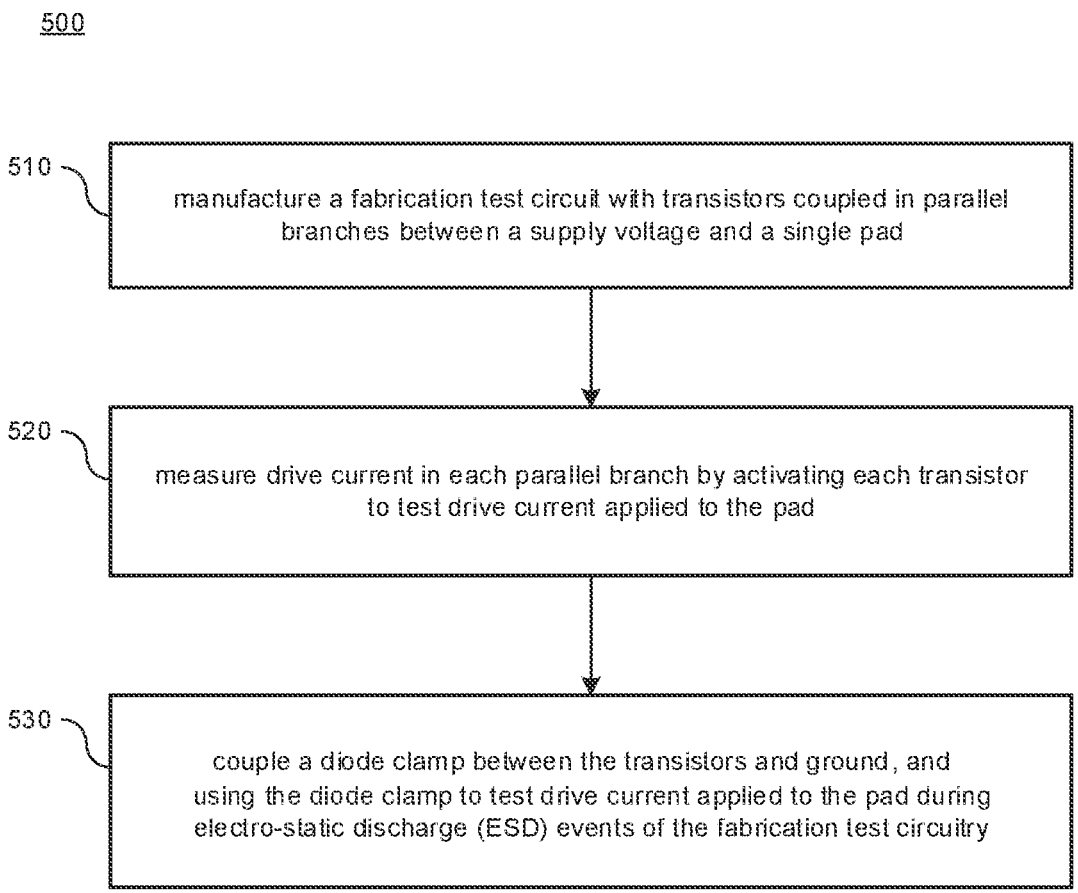
FIG. 5 illustrates a diagram of a method of providing current measurement architecture in accordance with various implementations described herein.

FIG. 5 illustrates a process flow diagram 500 of a method of providing current measurement architecture in accordance with implementations described herein.

It should be understood that even though the method 500 indicates a particular order of operation execution, in some instances, various certain portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various components and/or circuitry, as described herein in reference to FIGS. 1-3. Also, if implemented in software, method 500 may be implemented with program and/or software instruction processes configured for providing current measurement architecture, as described herein. Also, if implemented in software, instructions related to implementing the method 500 may be stored in memory and/or a database. In various instances, a computer or various other types of computing devices having a processor and memory may be configured to perform method 500.

In various implementations, method 500 may refer to a method for designing, providing, fabricating and/or manufacturing register bank architecture with latches as an integrated system, device and/or circuit that involves use of various IC circuit components described herein so as to thereby implement current measuring techniques associated therewith. Also, the current measurement architecture may be integrated with computing circuitry and various related components on a single chip, and the current measurement architecture may be implemented in various embedded systems for various electronic, mobile and Internet-of-things (IoT) applications, including sensor nodes.

At block 510, method 500 may manufacture a fabrication test circuit with transistors coupled in parallel branches between a supply voltage and a single pad. At block 520, method 500 may measure drive current in each parallel branch by activating each transistor to test drive current applied to the pad. At block 530, method 500 may couple a diode clamp between the transistors and ground, and method 500 may use the diode clamp to test drive current applied to the pad during electro-static discharge (ESD) events of the fabrication test circuitry. In various implementations, the drive current may refer to on-current operation of the transistors, the pad may function as a current source during on-current operation, and each transistor may be activated to test drive current passed by each transistor to the pad by separately driving current through each transistor to the pad. Also, measuring drive current in each parallel branch may include separately activating each transistor to test, measure, calculate and/or assess drive current applied to the pad by way of each transistor. Also, the parallel branches may include multiple branches coupled in parallel with each other branch having a single transistor coupled in parallel with each other single transistor so as to test drive current applied to the pad.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with fabrication test circuitry having transistors arranged in a parallel branch configuration between a supply voltage and a single pad. In some instances, each transistor in an off-current branch may be separately deactivated so as to test leakage current applied to the pad by way of the off-current branch, and each transistor in an on-current branch may be deactivated so as to further test the leakage current applied to the pad by way of the off-current branch.

Described herein are various implementations of a device with fabrication test circuitry having transistors arranged in a parallel branch configuration between a supply voltage and a single pad. In some instances, each transistor in each on-current branch may be separately activated so as to test drive current applied to the pad by way of each on-current branch, and each transistor in an off-current branch may be deactivated so as to further test the drive current applied to the pad by way of each on-current branch.

Described herein are various implementations of a method. The method may manufacture a fabrication test circuit with transistors that are coupled in parallel branches between a supply voltage and a single pad, and also, the method may measure leakage current in each parallel branch by separately deactivating each transistor to test leakage current applied to the pad.

Described herein are various implementations of a method. The method may manufacture a fabrication test circuit with transistors that are coupled in parallel branches between a supply voltage and a single pad, and also, the method may measure drive current in each parallel branch by activating each transistor to test drive current applied to the pad.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various related techniques described herein, other and further implementations may be devised in accordance with the disclosure herein, which may be determined by the claims that follow.

Although the subject matter has been described herein in language specific to structural features and/or methodological acts, it should be understood that the subject matter defined in the appended claims is not necessarily limited to the specific features or acts described above. Rather, specific features and acts described above are disclosed as example forms of implementing the claims.

What is claimed is:

1. A device comprising:
fabrication test circuitry with transistors arranged in a parallel branch configuration between a supply voltage and a single pad,
wherein each transistor in an off-current branch is separately deactivated so as to test leakage current applied to the single pad by way of the off-current branch, and
wherein each transistor in an on-current branch is deactivated so as to further test the leakage current applied to the single pad by way of the off-current branch.

2. The device of claim 1, wherein:
the leakage current refers to off-current operation of the transistors, and
the single pad functions as a current sink during off-current operation.

3. The device of claim 1, wherein:
each transistor in the off-current branch is separately deactivated so as to thereby measure, calculate and assess the leakage current or off-current applied to the single pad by way of the off-current branch, and
each transistor in the off-current branch is separately deactivated so as to thereby test leakage current passed by each transistor in the off-current branch to the single pad by way of significantly reducing drive current through each transistor to the single pad.

4. The device of claim 1, wherein:
the off-current branch includes a single off-current branch with multiple transistors coupled in series so as to test leakage current applied to the single pad by way of the off-current branch, and
the on-current branch includes multiple on-current branches with each on-current branch having a single transistor coupled in parallel with each other single transistor in each other on-current branch so as to further test leakage current applied to the single pad by way of the off-current branch.

5. The device of claim 1, further comprising:
a diode clamp coupled between the transistors and ground,
wherein the diode clamp tests drive current and leakage current applied to the single pad during electro-static discharge (ESD) events of the fabrication test circuitry.

6. A device comprising:
fabrication test circuitry with transistors arranged in a parallel branch configuration between a supply voltage and a single pad,
wherein each transistor in each on-current branch is separately activated so as to test drive current applied to the single pad by way of each on-current branch, and
wherein each transistor in an off-current branch is deactivated so as to further test the drive current applied to the single pad by way of each on-current branch.

7. The device of claim 6, wherein:
the drive current refers to on-current operation of the transistors, and
the single pad functions as a current source during on-current operation.

8. The device of claim 1, wherein:
each transistor in each on-current branch is separately activated so as to thereby measure, calculate and assess drive current or on-current applied to the single pad by way of each on-current branch, and
each transistor in each on-current branch is separately activated so as to thereby test drive current passed by each transistor in each on-current branch to the single pad by way of separately driving current through each on-current transistor to the single pad.

9. The device of claim 1, wherein:
the off-current branch includes a single off-current branch with multiple transistors coupled in series that are deactivated so as to test drive current applied to the single pad by way of each on-current branch, and
the on-current branch includes multiple on-current branches with each on-current branch having a single transistor coupled in parallel with each other single transistor in each other on-current branch so as to test drive current applied to the single pad by way of each on-current branch.

10. The device of claim 1, further comprising:
a diode clamp coupled between the transistors and ground,
wherein the diode clamp tests drive current and leakage current applied to the single pad during electro-static discharge (ESD) events of the fabrication test circuitry.

11. A method comprising:
manufacturing a fabrication test circuit with transistors coupled in parallel branches between a supply voltage and a single pad, and
measuring leakage current in each parallel branch by separately deactivating each transistor to test leakage current applied to the single pad.

12. The method of claim 11, wherein:
the leakage current refers to off-current operation of the transistors,
the single pad functions as a current sink during off-current operation, and
each transistor is deactivated to test leakage current passed by each transistor to the single pad by separately reducing drive current through each transistor to the single pad.

13. The method of claim 11, wherein measuring leakage current in each parallel branch includes separately deactivating each transistor to test, measure, calculate and assess leakage current applied to the single pad by way of each transistor.

14. The method of claim 11, wherein the parallel branches include multiple branches coupled in parallel with each branch having a single transistor coupled in parallel with each other single transistor so as to test leakage current applied to the single pad.

15. The method of claim 11, further comprising:
coupling a diode clamp between the transistors and ground,
using the diode clamp to test the leakage current applied to the single pad during electro-static discharge (ESD) events of the fabrication test circuit.

16. A method comprising:
    manufacturing a fabrication test circuit with transistors coupled in parallel branches between a supply voltage and a single pad; and
    measuring drive current in each parallel branch by activating each transistor to test drive current applied to the single pad.

17. The method of claim 16, wherein:
    the drive current refers to on-current operation of the transistors,
    the single pad functions as a current source during on-current operation, and
    each transistor is activated to test drive current passed by each transistor to the single pad by separately driving current through each transistor to the single pad.

18. The method of claim 16, wherein measuring drive current in each parallel branch includes separately activating each transistor to test, measure, calculate and assess drive current applied to the single pad by way of each transistor.

19. The method of claim 16, wherein the parallel branches include multiple branches coupled in parallel with each other branch having a single transistor coupled in parallel with each other single transistor so as to test drive current applied to the single pad.

20. The method of claim 16, further comprising:
    coupling a diode clamp between the transistors and ground,
    using the diode clamp to test drive current applied to the single pad during electro-static discharge (ESD) events of the fabrication test circuit.

* * * * *